US008645742B2

(12) United States Patent
Mitsuishi (10) Patent No.: US 8,645,742 B2
(45) Date of Patent: Feb. 4, 2014

(54) SEMICONDUCTOR DEVICE OPERATING ACCORDING TO AN OPERATION CLOCK AND HAVING A SERIAL COMMUNICATION INTERFACE PERFORMING EXTERNAL COMMUNICATIONS ACCORDING TO A UNIT TRANSFER TIME BASED ON THE OPERATION CLOCK

(75) Inventor: Naoki Mitsuishi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 572 days.

(21) Appl. No.: 12/951,004

(22) Filed: Nov. 20, 2010

(65) Prior Publication Data

US 2011/0129004 A1 Jun. 2, 2011

(30) Foreign Application Priority Data

Nov. 27, 2009 (JP) .................................. 2009-269786

(51) Int. Cl.
*G06F 1/00* (2006.01)
(52) U.S. Cl.
USPC .......................................................... 713/500
(58) Field of Classification Search
USPC .......................................................... 713/500
See application file for complete search history.

(56) References Cited

U.S. PATENT DOCUMENTS

| 6,028,728 A * | 2/2000 | Reed .............................. 360/51 |
| 6,349,071 B1 * | 2/2002 | Yoshimoto ............... 365/233.14 |
| 7,079,573 B2 | 7/2006 | Shona |
| 2011/0175866 A1 * | 7/2011 | Uehara et al. ................. 345/204 |

FOREIGN PATENT DOCUMENTS

| JP | 11-149325 A | 6/1999 |
| JP | 2001-168853 A | 6/2001 |
| JP | 2003-324413 A | 11/2003 |

OTHER PUBLICATIONS

Fujimura Katsuya, Japanese Patent literatur 2001-168853.*
Office Action issued Jul. 4, 2013, in Japanese Patent Application No. 2009-269786.

* cited by examiner

*Primary Examiner* — Mohammed Rehman
(74) *Attorney, Agent, or Firm* — Miles & Stockbridge P.C.

(57) ABSTRACT

Serial communication with a bit rate close to a required bit rate can be performed, regardless of the frequency of an operation clock.
A semiconductor device includes a serial communication interface that operates according to a certain operation clock. The serial communication interface is provided with a baud rate generator that generates a basic clock for counting the operation clock to define the unit transfer time based on the count, and a transmission/reception controller for performing control of transmission and reception according to the generated basic clock. Further, the serial communication interface is provided with a bit rate modulator capable of realizing a desired bit rate by partially masking supply of the operation clock to the baud rate generator, and thereby serial communication with a bit rate close to a required bit rate is realized.

5 Claims, 8 Drawing Sheets

| MCNT / BMR | 0 | 1 | 2 | 3 | 4 | ... | 62 | 63 | 64 | ... | 126 | 127 | 128 | ... | 194 | 195 | 196 | ... | 254 | 255 |
|---|---|---|---|---|---|---|---|---|---|---|---|---|---|---|---|---|---|---|---|---|
| 0 | O | | | | | | | | | | | | | | | | | | | |
| 1 | | O | | | | | | | | | | | | | | | | | | |
| 2 | | | O | | | | | | | | | | | | | | | | | |
| 3 | | | | O | | | | | | | | | | | | | | | | |
| 4 | | | | | | | | | | | | | | | | | | | | |
| ... | | | | | | | | | | | | | | | | | | | | |
| 62 | | | | | | | O | | | | | | | | | | | | | |
| 63 | | | | | | | | O | | | | | | | | | | | | |
| 64 | | | | | | | | | | | | | | | | | | | | |
| ... | | | | | | | | | | | | | | | | | | | | |
| 126 | | | | | | | | | | | O | | | | | | | | | |
| 127 | | | | | | | | | | | | O | | | | | | | | |
| 128 | | | | | | | | | | | | | | | | | | | | |
| ... | | | | | | | | | | | | | | | | | | | | |
| 194 | | | | | | | | | | | | | | | O | | | | | |
| 195 | | | | | | | | | | | | | | | | O | | | | |
| 196 | | | | | | | | | | | | | | | | | | | | |
| ... | | | | | | | | | | | | | | | | | | | | |
| 254 | | | | | | | | | | | | | | | | | | | O | |
| 255 | | | | | | | | | | | | | | | | | | | | O |

(Note: Additional O markings appear throughout the table indicating the coverage pattern — full row of O's in row 255 across all columns, and progressive filling patterns across the matrix as shown in the original figure.)

| INTERNAL CLOCK ICK | IDEAL BIT RATE | BIT RATE MODULATION ||||||
| | | NOT USING |||  USING |||
| | | BCK | BRR | ERROR | BRR | BMR | ERROR |
| 10.667 | 115.2 | 16 | 1 | -27.6 | 1 | 184 | 0.1 |
| 10.667 | 460.8 | 8 | 0 | -27.6 | 0 | 184 | 0.1 |
| 16 | 921.6 | 8 | 0 | -45.7 | 0 | 128 | 0.1 |
| 16 | 115.2 | 16 | 1 | 8.5 | 2 | 184 | 0.1 |
| 16 | 460.8 | 8 | 0 | 8.5 | 1 | 128 | 0.1 |
| 16 | 720 | 8 | 2 | -30.6 | 5 | 177 | 0.1 |
| 24 | 115.2 | 16 | 1 | 8.5 | 2 | 138 | -0.1 |
| 24 | 460.8 | 8 | 0 | -18.6 | 0 | 138 | 0.1 |
| 24 | 921.6 | 8 | 0 | -18.6 | 1 | 207 | 0.2 |
| 32 | 720 | 8 | 0 | 38.9 | 1 | 177 | 0.1 |

FIG. 8

SEMICONDUCTOR DEVICE OPERATING ACCORDING TO AN OPERATION CLOCK AND HAVING A SERIAL COMMUNICATION INTERFACE PERFORMING EXTERNAL COMMUNICATIONS ACCORDING TO A UNIT TRANSFER TIME BASED ON THE OPERATION CLOCK

CROSS-REFERENCE TO RELATED APPLICATION

The disclosure of Japanese Patent Application No. 2009-269786 filed on Nov. 27, 2009 including the specification, drawings and abstract is incorporated herein by reference in its entirety.

BACKGROUND OF THE INVENTION

The present invention relates to a semiconductor device, further, to a serial communication technology therein, and to a technology effective when applied, for example, to a microcomputer.

A microcomputer (also called a data processing device or microprocessor) as an example of a semiconductor device is widely used for the purpose of equipment control. An SCI (Serial Communication Interface) for performing serial data communication is incorporated in a microcomputer. Data is transmitted or received bit by bit via the SCI. The speed of transmitting or receiving one bit is called a bit rate. An SCI has an asynchronous communication mode for which a bit rate is predetermined between the transmit side and the receive side. The difference or error between the bit rate on the transmit side and that of the receive side needs to be small. Further, there are specific speeds that are generally used for a bit rate, such as 460.4 kbps, for example.

Inside a microcomputer, one bit period is measured, based on the operation clock of the microcomputer or the SCI. An operation clock of a microcomputer also has a specific frequency generally used, such as 10.667 MHz, for example.

In a case of an asynchronous communication method, as it is necessary to detect the communication state only by data, a basic clock that is 8 times or 16 times of a bit rate is used. The basic clock is formed based on the operation clock of a microcomputer or an SCI. With reference to the basic clock, a start is detected, and then, according to a predetermined bit rate, subsequent data is sampled at the center of the bit. For the measurement of the above-described one bit period, the basic clock is measured, and further, 8 or 16 basic clocks are measured.

Japanese Patent Laid-Open No. 2001-168853 (Patent Document 1) and Japanese Patent Laid-Open No. 1999-149325 (Patent Document 2) are examples of documents describing a serial data communication technology.

Patent Document 1 describes a technology for eliminating failure to receive data, even when a data transfer speed significantly changes.

Patent Document 2 describes a technology for realizing a receive-serial-clock generation circuit that enables, even when a frequency that is N (N is a natural number.) times of a targeted serial transfer speed cannot be provided as an input clock, data reception at this transfer speed.

SUMMARY OF THE INVENTION

In an SCI incorporated in a microcomputer, an operation clock and a bit rate are independently given, and it sometimes occurs that bit rate errors cannot be inhibited to a practical degree on the transmit side and on the receive side. For example, in a case where the operation clock of a microcomputer is 10.667 MHz; the bit rate thereof is 460.4 kbps; and the basic clock of the SCI incorporated in the microcomputer is 8 times of the bit rate, if two operation clocks are counted to generate a basic clock, the bit rate will become 666.7 kbps. Otherwise, if the above-described two counts are changed to one count, the bit rate will become 1333.3 kbps, and if changed to three counts, the bit rate will become 355.6 kbps, causing discrete variation in bit rates that can be realized. In this situation, a required bit rate cannot be realized. Reversely, if the frequency of the operation clock of a microcomputer is sufficiently high for the bit rate, the count value of measuring the basic clocks will become sufficiently large, which enables finer adjustment. However, the communication speed becomes low in this case.

Hence, the inventor of the present application has examined a method that thins basic clocks on the receive side with a certain ratio so as to make the bit rate evenly close to a required bit rate. As a result, it has been proved that, if basic clocks are thinned, the timings of transmission and reception, such as one bit period in transmission, detection of a start in reception, and sampling of data, are shifted. In this case, application to a combination of a specific operation clock and a bit rate determined through designing is possible, however, application to other arbitrary combinations is difficult.

These problems are not considered in Patent Documents 1, 2.

The basic clock may be taken in from outside. In this case, an arbitrary bit rate can be controlled independently from the operation clock. However, in this case, another resource for generation of input signals as an external clock is necessary. Further, additional wiring on the substrate of the microcomputer is necessary. In particular, when the other side of transmission or reception is not present on the same substrate, it is difficult to provide additional wiring, and accordingly, the basic clock cannot necessarily be supplied from the other side of transmission or reception.

The present invention has been made in view of the above circumstances and provides in a case of generating a basic clock based on an operation clock on the receive side, a technology for performing serial communication at a bit rate close to a required bit rate regardless of the frequency of the operation clock.

The other purposes and the new feature of the present invention will become clear from the description of the present specification and the accompanying drawings.

The following explains briefly the outline of a typical invention among the inventions disclosed in the present application.

A semiconductor device is provided with a serial communication interface that operates according to a certain operation clock, and performs serial communication with outside, according to a unit transfer time based on the operation clock. The serial communication interface includes a baud rate generator that generates a basic clock for counting the operation clock to define the unit transfer time based on a result of the count, and a transmission/reception controller for performing control of transmission and reception according to the basic clock generated by the baud rate generator. Further, the serial communication interface includes a bit rate modulator that realizes a desired bit rate by partially masking the supply of the operation clock to the baud rate generator, according to pre-set information.

A bit rate modulator 203 realizes a desired bit rate by partially masking the supply of the operation clock to the baud rate generator, according to pre-set information. This realizes serial communication at a bit rate close to a required bit rate, regardless of the frequency of the operation clock.

The following explains briefly the effect acquired by the typical invention among the inventions disclosed in the present application.

That is, it is possible to provide, in a case of generating basic clocks based on operation clocks on the communication side, a technology for performing serial communication at a bit rate close to a required bit rate, regardless of the frequency of the operation clock.

DETAILED DESCRIPTION OF PREFERRED EMBODIMENT

1. Outline of Embodiment

First, the outline of a typical embodiment among embodiments in accordance with the invention disclosed in the present application will be described. Reference symbols, in the drawings, referred to in the description of the outline of the typical embodiment only represent examples included in the concept of the elements assigned with the reference symbols.

[1] A semiconductor device (100) in the typical embodiment in accordance with the invention includes a serial communication interface (109) that operates according to a certain operation clock, and performs serial communication with outside according to a unit transfer time based on the operation clock. The serial communication interface includes a baud rate generator (202) that generates basic clocks (BCK) for counting the operation clock to define the unit transfer time based on a result of the count, and a transmission/reception controller (201) for performing transmission/reception control, according to the basic clock generated by the baud rate generator. Further, the serial communication interface includes a bit rate modulator (203) that realizes a desired bit rate by partially masking the supply of the operation clock to the baud rate generator, according to preset information. As the operation clock, internal clock (ICK) can be used.

[2] In item [1], the bit rate modulator (203) can include a first counter (MCNT) for counting the operation clock, a weight reversing circuit (303) for reversing the weight for the output bits of the first counter, and a first register (BMR) that allows information for determining the duty of the basic clocks to be set. Further, the bit rate modulator (203) can include a first comparator (304) for comparison between the output of the weight-reversing circuit and the output of the register, and a logic gate (302) for partially masking the supply of the operation clock to the baud rate generator by performing logical operation between a comparison result from the comparator and the operation clock.

[3] In item [2], the weight reversing circuit can be configured so as to reverse the weight for the output bits of the first counter by changing an order of sequence of the output bits of the first counter.

[4] In item [2], the baud generator 202 can be configured so as to include a second counter (BCNT) for counting the output of the logical gate, a second register (BRR) for setting a bit rate, and a second comparator (301) for comparing the output of the second counter with the output of the second register to form the basic clock.

[5] In item [4], the above-described unit transfer time is composed of a plurality of count units in the second counter (BCNT), and the transmission/reception controller (201) can be configured to include a function of detecting a start bit taken into the serial communication interface from outside to synchronize the count units so that the input to the serial communication interface is sampled based on a certain result of the count by the second counter after the synchronization.

[6] In item [5], the above-described semiconductor device can be formed as a microcomputer such as to include a CPU that controls the operation of the serial communication interface.

2. Details of Embodiment

An embodiment will be described in further detail.

Embodiment 1

Figure 1:
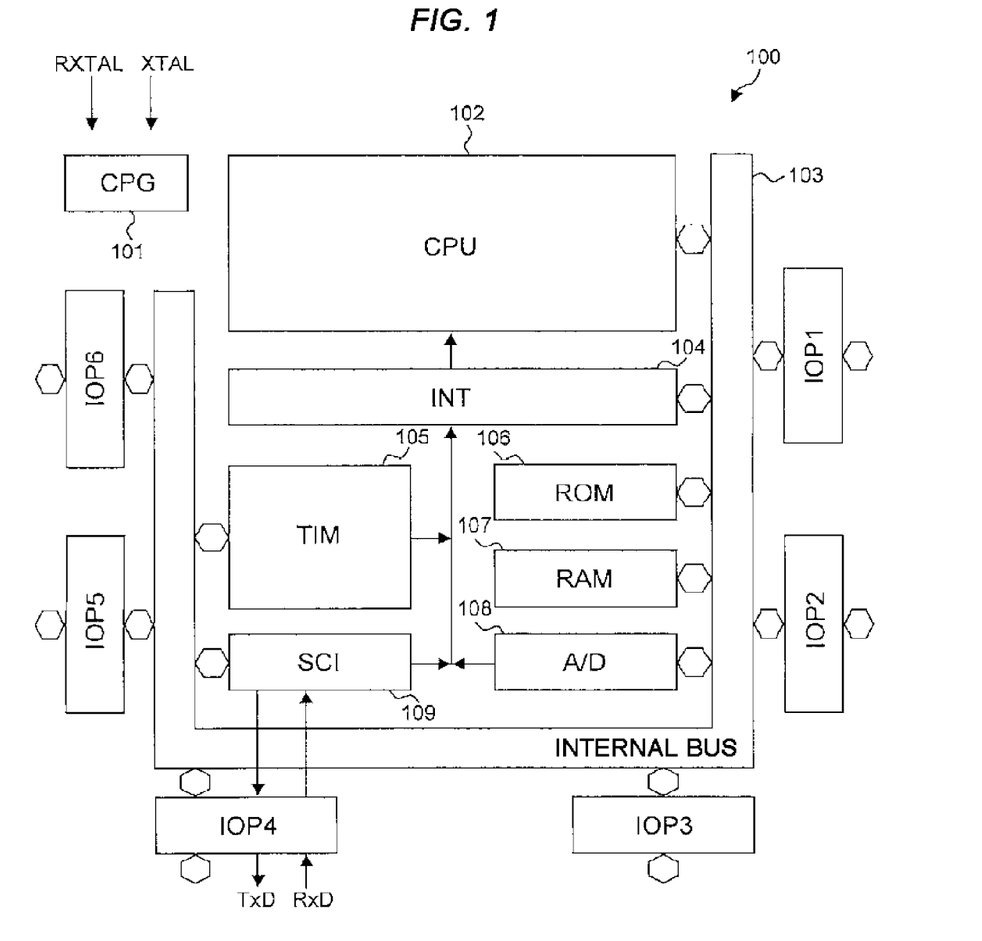
FIG. 1 is a block diagram of a configuration example of a microcomputer as an example of a semiconductor device according to the present invention.

FIG. 1 shows a microcomputer as an example in accordance with the invention. A microcomputer 100, shown in FIG. 1, is formed on one semiconductor substrate, such as a single crystal silicon substrate, according to a known semiconductor integrated circuit manufacturing technology. The microcomputer 100 includes a clock generation circuit (CPG) 101, a CPU (Central Processing Unit) 102, an interrupt control circuit (INT) 104, a timer (TIM) 105, a ROM (Read Only Memory) 106, a RAM (Random Access Memory) 107, an A/D convertor 108, an SCI 109, and input/output ports IOP0 to IOP6.

The RAM 107 stores data to be processed through execution of an operation program by the CPU 102, and serves also as a temporary storage area, in other words, a work area in a calculation process by the CPU 102. The clock generation circuit 101 is coupled with external terminals (EXTAL, XTAL) for input of clocks from outside or coupling with a crystal oscillator or the like and generates an internal clock ICK of a specific frequency. The generated internal clock ICK is supplied to respective sections via a clock line as an operation clock for the microcomputer 100. The CPU 102 controls the microcomputer 100, based on a program or the like stored in the ROM 106. The ROM 106 stores an operation program for the CPU 102 and fixed data necessary for the program. The timer 105 counts a time having been set, sets a flag and generates an interrupt request when the set time has expired. The A/D convertor 108 converts an analog signal having been input into a digital signal. The SCI 109 performs serial communication with an external device. When interrupt requests are issued from the A/D convertor 108, the timer 105, and the SCI 109 to the CPU 102, an interrupt control circuit 104 processes the interrupt requests, according to a predetermined priority order. The input/output ports IOP1 to IOP6 perform input and output of various signals with outside.

The CPU 102, the interrupt control circuit 104, the ROM 106, the RAM 107, the A/D convertor 108, the timer 105, the SCI 109, and the input/output ports IOP1 to IPO6 are coupled with each other via an internal bus 103. Further, the SCI 109 is coupled with the input/output port IOP4 to perform serial communication with the external device via the input/output port IOP4. In this serial communication, transmission data is referred to as TxD, and received data is referred to as RxD.

Figure 2:
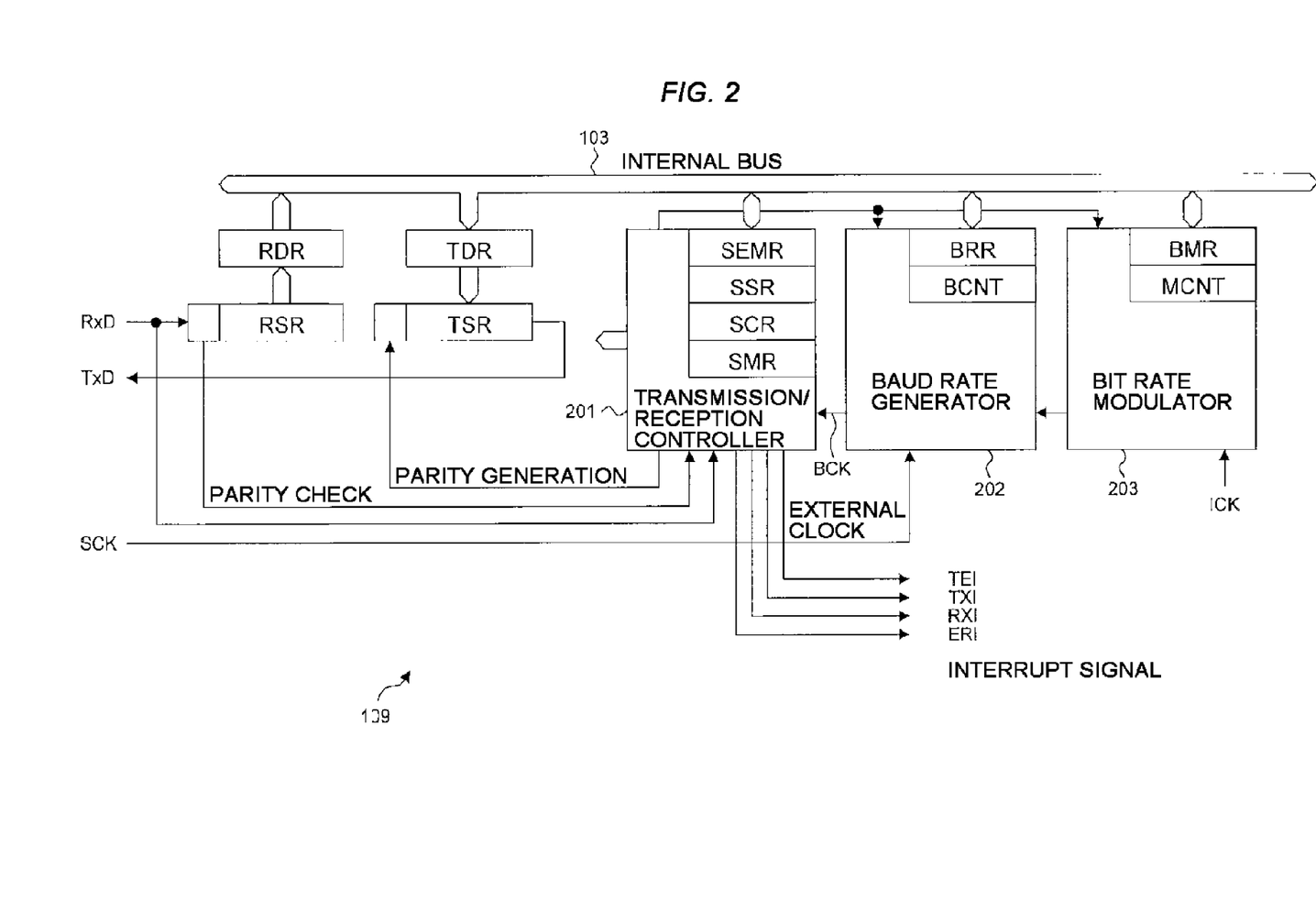
FIG. 2 is a block diagram of a configuration example of an SCI included in the microcomputer.

FIG. 2 shows a configuration example of the SCI 109.

The SCI 109 includes a receive data register RDR, a receive shift register RSR, a transmit data register TDR, a transmit shift register TSR, a transmission/reception controller 201, a baud rate generator 202, and a bit rate modulator 203.

The receive shift register RSR stores input data RxD bit by bit. When certain data (for example, data of 8 bits) has been received, the content of the data is transferred to the receive data register RDR. The content of the receive data register RDR can be read out by the CPU 102 via the internal bus 103.

The CPU 102 can write transmission data into the transmit data register TDR via the internal bus 103. When transmission is started, the content of the transmit data register TDR is transferred to the transmit shift register TSR. The transmit shift register TSR outputs data bit by bit. This data is output data TxD.

The transmission/reception controller 201 designates the mode and the format of transmission/reception and indicates the status. Therefore, a mode register SMR for designation of a mode and an expansion mode register SEMR, a control register SCR for designation of a format, and a status register SSR for holding status bits are provided. Further, the transmission/reception controller 201 takes in, for parity check, parity bits included in received data, and adds parity bits to transmission data. Interrupt signals (TEI, TXI, RXI, and ERI) for interrupt requests are generated by the transmission/reception controller 201.

The bit rate modulator 203 includes a bit rate modulation register BMR and a bit rate modulation counter MCNT, and partially masks the supply of the internal clock ICK to the baud rate generator 202, based on set information of the bit rate modulation register BMR, thereby realizing a desired bit rate. The partial masking of the internal clock ICK is performed such that the unit transfer time in the SCI 109 is made even over a plurality of count units.

The baud rate generator 202 includes a bit rate register BRR and a bit rate counter BCNT and generates a basic clock BCK for defining a unit transfer time. The internal clocks ICK transmitted from the bit rate modulator 203 are counted, and the basic clock BCK is generated based on a result of the count. The baud rate generator 202 may be set so as to generate the basic clock BCK using an external clock SCK.

Figure 3:
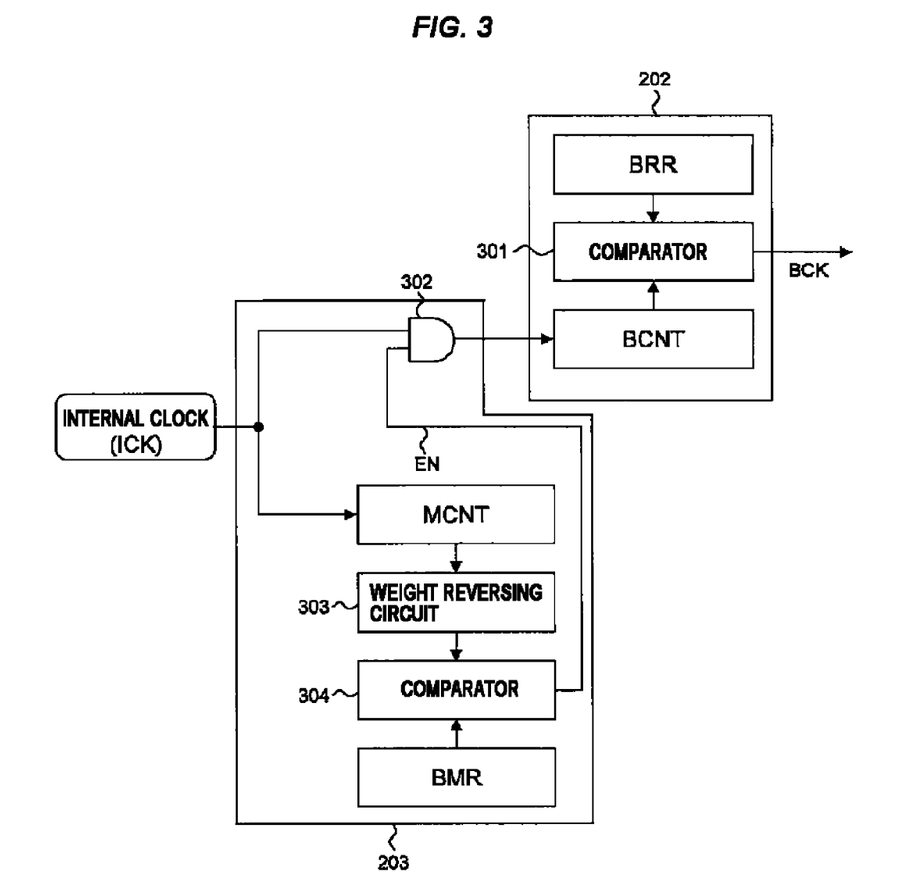
FIG. 3 is a block diagram of a configuration example of a baud rate generator and a bit rate modulator included in the SCI.

FIG. 3 shows a configuration example of the baud rate generator 202 and the bit rate modulator 203.

The bit rate modulator 203 includes an AND gate 302, the bit rate modulation counter MCNT, a weight reversing circuit 303, a comparator 304, and the bit rate modulation register BMR. The bit rate modulation counter MCNT has, for example, an 8 bit configuration, and counts internal clocks ICK from zero to 255. The output from the bit rate modulation counter MCNT is weight-reversed by the weight reversing circuit 303, and then transmitted to the comparator 304. Weight reversing by the weight reversing circuit 303 is realized by changing the order of the bit sequence of the output from the bit rate modulation counter MCNT. For example, representing the bit sequence of the output of the bit rate modulation counter MCNT by MCNT[7], . . . , MCNT[1[, and MCNT[0], the weight reversing circuit 303 changes the order of the bit sequence to MCNT[0], MCNT[1], . . . , MCNT[7].

The duty (obtained by dividing the pulse width with the pulse period.) of an enable signal EN is set in the bit rate modulation register BMR. The comparator 304 compares the output of the weight reversing circuit 303 with the output of the bit rate modulation register BMR to form an enable signal EN. That is, the enable signal EN is asserted, for example, high, within one cycle (unit of 256) of the output of the bit rate modulation counter MCNT and in periods specified by the output of the bit rate modulation register BMR. Accordingly, when BMR≥{MCNT[0], MCNT[1], . . . , MCNT[7]} is satisfied, the enable signal EN is asserted. The reason of reversing the weight of the bits of the bit rate modulation counter MCNT by the weight reversing circuit 303 is to make the assertion timings of the enable signal EN smooth or even in the count cycle of the bit rate modulation counter MCNT without bias. The enable signal EN is transmitted to one input terminal of the AND gate 302. The internal clock ICK is transmitted to the other input terminal of the AND gate 302. Thus, the internal clock ICK is transmitted to the baud rate generator 202 via the AND gate 302 in a period when the enable signal EN is high, and is not transmitted to the baud rate generator 202 in a period when the enable signal EN is low.

The baud rate generator 202 includes the bit rate register BRR, the comparator 301, and the bit rate counter BCNT. The bit rate counter BCNT counts the internal clocks ICK transmitted via the AND gate 302 in the bit rate modulator 203. The output of the bit rate counter BCNT is always compared with the output of the bit rate register BRR by the comparator 301. The output of the comparator 301 is a basic clock BCK. If the both outputs agree with each other in the comparison by the comparator 301, the bit rate counter BCNT is cleared to '0'. In such a manner, cyclic count is performed and the basic clock BCK is generated.

Figure 4:
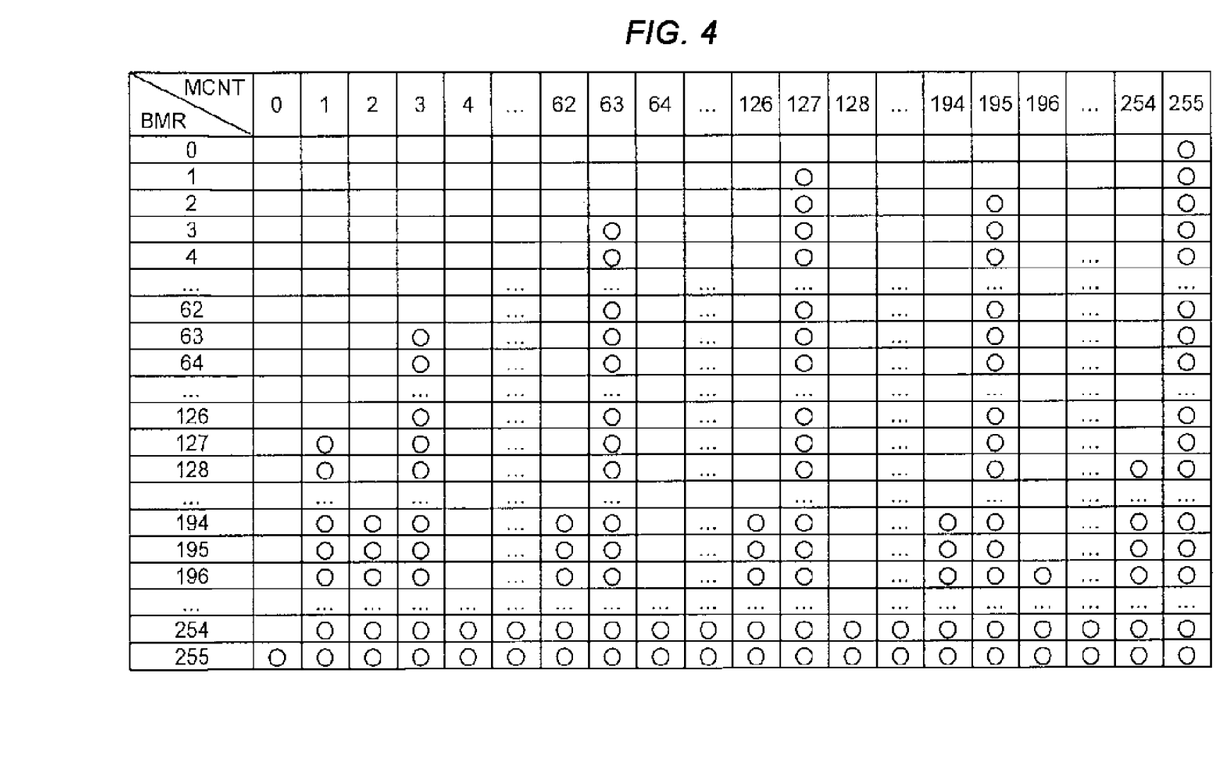
FIG. 4 is an illustration of an output mode of an enable signal in the bit rate modulator.

FIG. 4 shows a state of output of the enable signal EN.

As described above, when BMR≥{MCNT[0], MCNT[1], . . . , MCNT [7]} is satisfied, the comparator 304 asserts the enable signal EN. In FIG. 4, the horizontal axis represents MCNT count values, and the vertical axis represents BMR count values. The enable signal EN is asserted at positions with a mark ○. For example, if BMR is set as BMR=2, the enable signal EN is asserted when MCNT=127, 195, and 255. If BMR is set as BMR=63, the enable signal EN is asserted when MCNT is a multiple of 4+3. If BMR is set as BMR=127, the enable signal EN is asserted when MCNT is an even number. In the configuration shown in FIG. 3, reversing the weight of the bits of the bit rate modulation counter MCNT by the weight reversing circuit 303 makes the positions with a mark ○ be evenly disposed without being biased with respect to the vertical axis direction. In other words, the active state of the enable signal EN is smoothed or even such that the positions of the active state are distributed without bias within a period.

Figures 5, 5A:
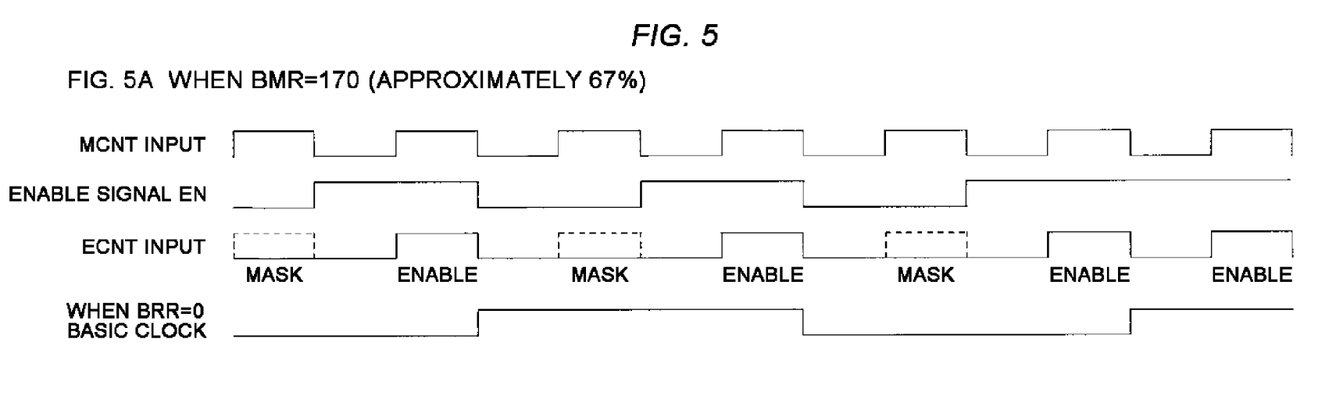
FIG. 5 is a timing diagram of generating a basic clock in the SCI.

FIG. 5 shows the timing of generating the basic clock BCK.

Herein, a case of the highest bit rate in comparison with the operation clock, namely, BRR=0 is shown. In this case, a basic clock BCK is toggled each time the bit rate counter BCNT counts up.

The enable signal EN inhibits count-up of the bit rate counter BCNT. FIG. 5A shows a case where BMR is set as BMR=170 (approximately 67%), and a count-up clock to be input to the bit rate counter BCNT is obtained, in average, 4 times out of 7 times of original count-up clock (selected internal clock ICK). When the enable signal EN is negated low, count-up clocks to the bit rate counter BCNT are masked, and thus the bit rate counter BCNT is not counted up.

Figure 5B:
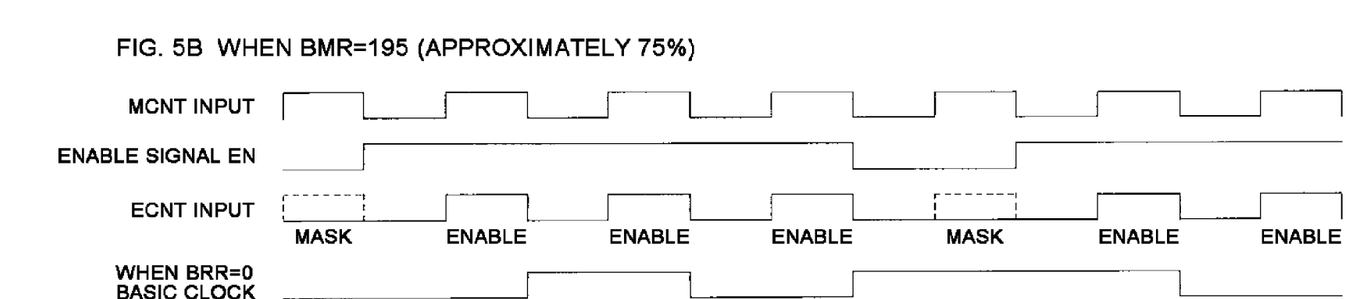

FIG. 5B shows a case where BMR=195 (75%), and a count-up clock to be input to BCNT is obtained, in average, 5 times out of 7 times of original count-up clock (selected internal clock ICK). Similarly to the case shown in FIG. 5A, when the enable signal EN is negated low, count-up clocks to the bit rate counter BCNT are masked, and thus the bit rate counter BCNT is not counted up.

An error in thus generated basic clock BCK is inhibited to an error for one period at the maximum with respect to original count-up clock (internal clock ICK).

Figure 6:
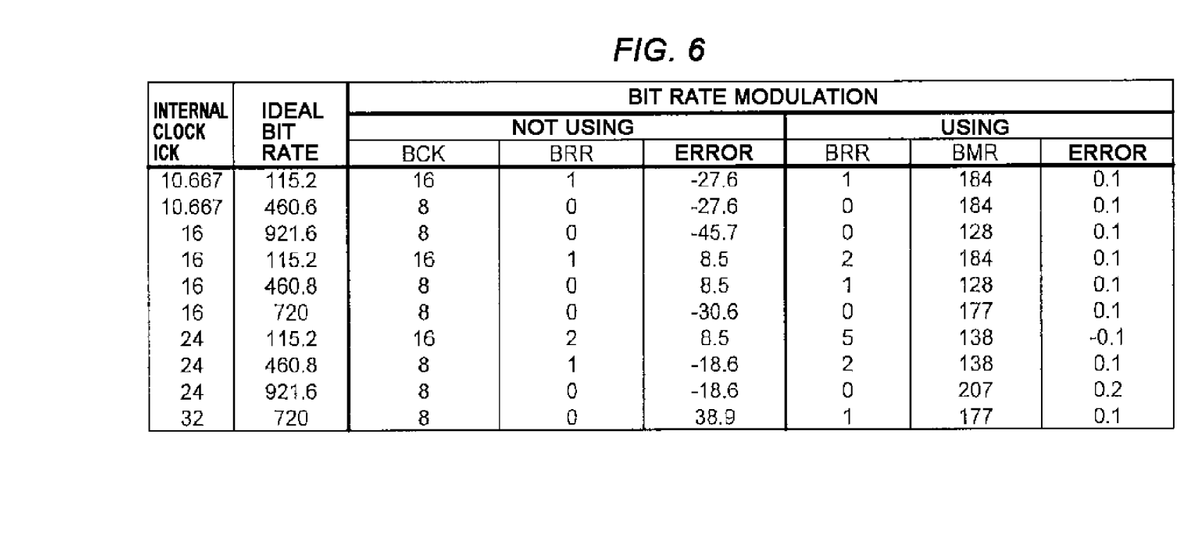
FIG. 6 is an illustration of bit rate errors in the SCI.

FIG. 6 shows bit rate errors in the case of not using the bit rate modulator 203 and in the case of using the bit rate modulator 203, wherein required bit rate is high with respect to the internal clock ICK of the microcomputer 100. It is assumed that, when the bit rate modulator 203 is not used, the internal clock ICK is input to the bit rate counter BCNT as is.

A bit rate error in the case of not using the bit rate modulator 203 is represented by the following expression.

$$\text{error} = ((f \times 10^6)/(B \times 64 \times 2^{2n-1} \times (BRR+1)) - 1) \times 100$$

A bit rate error in the case of using the bit rate modulator 203 is represented by the following expression.

$$\text{error} = ((f \times 10^6)/(B \times 64 \times 2^{2n-1} \times ((BMR+1)/256) \times (BRR+1)) - 1) \times 100$$

In these expressions, '$\phi \times 10^6$' represents the frequency of the internal clock ICK, 'B' represents an expected bit rate, 'BMR' represents the output value of the bit rate modulation register, and 'BRR' represents the output value of the bit rate register BRR.

The bit rate error is 50% at the maximum when the bit rate modulator 203 is not used. Using the bit rate modulator 203, when the bit rate modulation counter MCNT and the bit rate modulation register BMR are of 8 bits, the bit rate error can be made approximately 0.2% because the error is corrected with 256 resolution.

Figure 7:
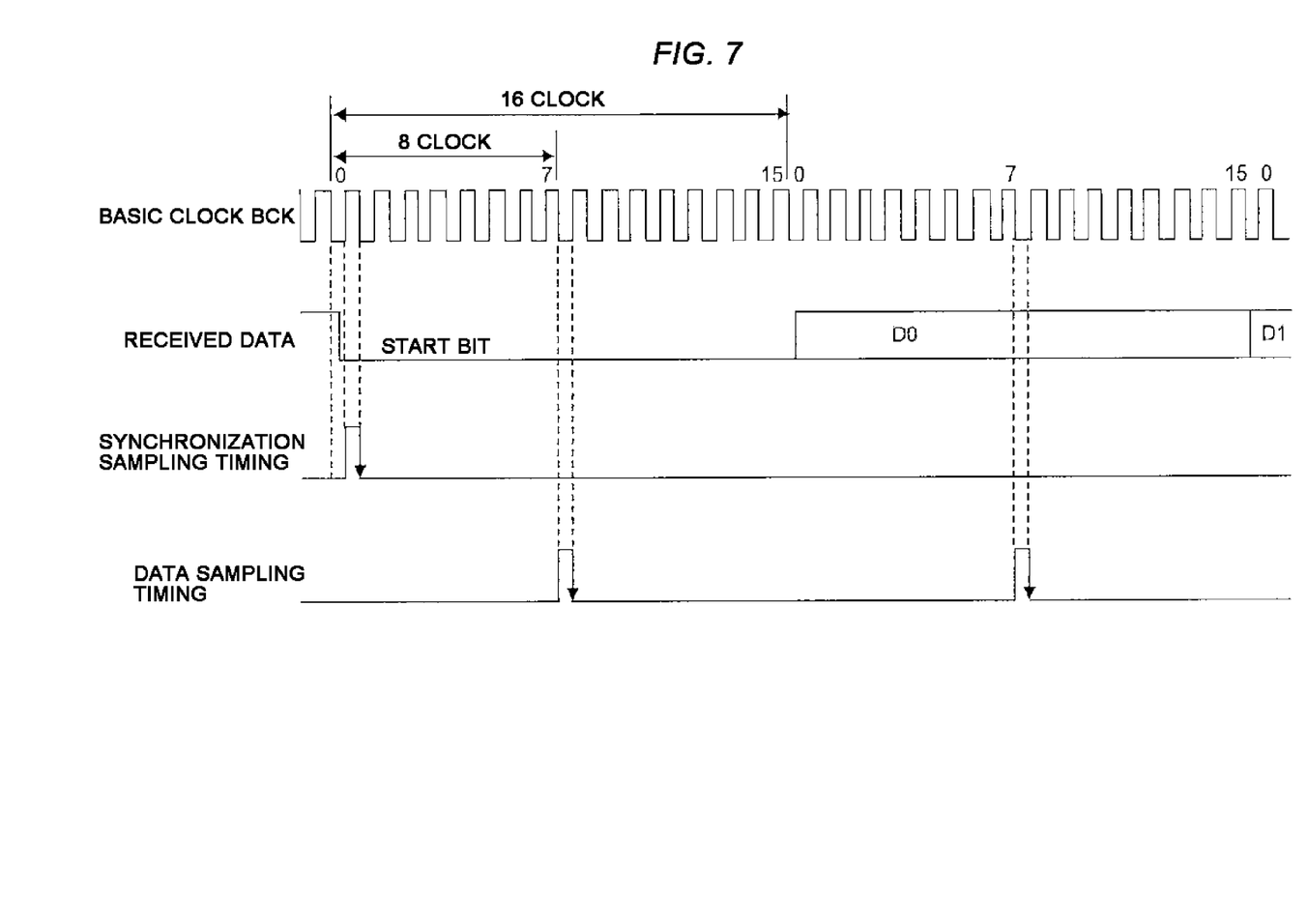
FIG. 7 is a timing diagram of sampling received data in an asynchronous communication mode.

FIG. 7 shows the operation timing of the SCI 109.

In the asynchronous communication mode, the SCI 109 operates with the basic clock BCK of a frequency that is 8 or 16 times of a bit rate. In the figure, the basic clock BCK of a frequency that is 16 times of the bit rate is used. Herein, the time for 16 clocks is a unit transfer time, and the time for one clock is a count unit.

In receiving data, the inside of the SCI 109 is synchronized by sampling the fall of a start bit with a basic clock BCK. Further, by sampling the received data at the eighth rising edge of basic clock BCK, the data is taken in at the center of each bit. In FIG. 7, a synchronization sampling timing is expressed as the falling edge of the basic clock BCK, and the data sampling timing is expressed as the rising edge of the basic clock BCK.

The maximum error of the basic clock BCK corresponds to one period of original count-up clocks, and further errors are made smooth or even. Therefore, variation in the time of each bit can be likewise inhibited, and thereby a desired transfer rate can be evenly obtained. Transmission and reception data are sampled at the timing corresponding to the center of the bit, and accordingly, even if variation in the time of each bit occurs, there is no problem as long as the data is neither delayed nor advanced.

By adjusting the timing of generating the basic clock BCK as described above, variation in the sampling timing also can be reduced. Thus, the SCI 109 can perform transmission and reception flexibly and with high accuracy.

Figure 8:
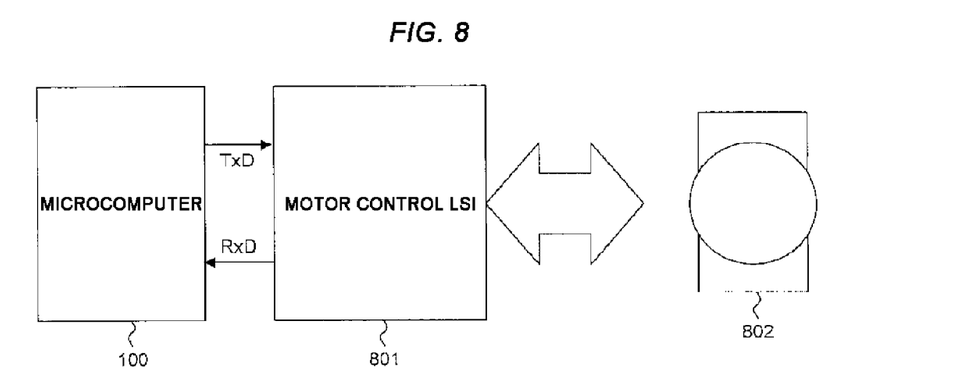
FIG. 8 is a block diagram showing an application example of the microcomputer.

FIG. 8 shows a communication system to which the microcomputer 100 is applied.

The microcomputer 100 controls a motor control LSI 801. The motor control LSI 801 performs control of driving a motor 802. It is possible to confirm the state of the motor control LSI 801 and provide a control command to the motor control LSI 801 via the SCI 109 of the microcomputer 100.

Flexible and highly accurate transmission and reception can be performed by adjusting the timing of generating the basic clock BCK with the SCI 109, and thereby wasteful energy consumption can be reduced. In a case where the operation frequency of the motor control LSI is high, even when the operation frequency of the microcomputer is relatively low, communication with slight errors and high quality can be performed.

According to Embodiment 1, the following operational effects can be obtained.

(1) The microcomputer 100 includes the serial communication interface 109 that operates according to a certain operation clock and performs serial communication with outside according to a unit transfer time based on the operation clock, wherein the serial communication interface includes the baud rate generator 202, the transmission/reception controller 201, and the bit rate modulator 203. The bit rate modulator 203 partially masks supply of the operation clock to the baud rate generator, according to preset information, thereby realizing a desired bit rate. As has been described above, referring to FIG. 6, when the bit rate modulator 203 is not used, the bit rate error becomes 50% at the maximum. When the bit rate modulator 203 is used, in a case where the bit rate modulation counter MCNT and the bit modulation register BMR are of 8 bits, the bit rate is corrected with 256 resolution, and thereby the bit rate error can be decreased to approximately 0.2%. In such a manner, the bit rate error can be significantly reduced by using the bit rate modulator 203, which enables serial communication at a bit rate close to a required bit rate, regardless of the frequency of the internal clock ICK.

(2) The bit rate modulator 203 can be easily configured, including the AND gate 302, the bit rate modulation counter MCNT, the weight reversing circuit 303, the comparator 304, and the bit rate modulation register BMR. The bit rate modulation counter MCNT is configured, for example, with 8 bits to count the internal clocks ICK from 0 to 255. The output of the bit rate modulation counter MCNT is weight-reversed by the weight reversing circuit 303 and then transmitted to the comparator 303. The weight reversing by the weight reversing circuit 303 is realized by changing the order of the bit sequence of the output of the bit rate modulation counter MCNT. By reversing the weight of the bits from the bit rate modulation counter MCNT by the weight reversing circuit 303, it is possible to attain smooth or even assertion timings of the enable signal EN in the count period of the bit rate modulation counter MCNT without bias.

(3) The weight reversing circuit 303 can be easily configured by wiring for changing the order of the bit sequence of the output of the bit rate modulation counter MCNT.

(4) The baud rate generator 202 can be easily configured, including the bit rate counter BCNT for counting the output of the AND gate 302, the bit rate register BRR for setting a bit rate, and the comparator 301 for comparing the output of the bit rate counter BCNT with the output of the bit rate register BRR to form the basic clock BCK.

(5) The unit transfer time is composed of a plurality of count units by the bit rate counter BCNT, and the transmission/reception controller 201 includes a function of detecting a start bit taken into the SCI 109 from outside to synchronize the above-described count units. Herein, based on a certain result by the bit rate counter BCNT after the synchronization, input to the SCI 109 is sampled, and thereby sampling of received data can be appropriately performed.

(6) With the microcomputer 100 configured as described above, the bit rate error can be significantly reduced by the use of the bit rate modulator 203. Accordingly, serial communication can be performed at a bit rate close to a required bit rate, regardless of the frequency of the internal clock ICK. For example, in a communication system (refer to FIG. 8) to which the microcomputer 100 is applied, flexible and highly accurate transmission and reception can be performed by adjusting the timing of generating the basic clock BCK, which reduces wasteful energy consumption. Further, in a case where the operation frequency of a motor control LSI is high, even when the operation frequency of the microcomputer is relatively low, communication with slight errors and high quality can be performed.

In the foregoing, the invention made by the inventor has been concretely described, based on an embodiment. However, it is needless to say that the present invention is not limited to the foregoing embodiment and various modifications and alterations can be made within a scope without departing from the spirit of the present invention.

For example, the weight reversing circuit 303 has been configured to change the order of the bit sequence of the output of the bit rate modulation counter MCNT, however, the invention is not limited thereto. For example, the weight may be changed by referring to a certain table, based on the output of the bit rate modulation counter MCNT. In this case, this table stores information for realization of an output mode of an enable signal EN, such as shown in FIG. 4.

Further, the SCI 109 can be mounted on a semiconductor device other than the microcomputer 100. For example, a case can be considered where the SCI 109 is mounted on a DSP (Digital Signal Processor) specialized for digital signal processing, and the invention can be applied also to such a case.

What is claimed is:

1. A semiconductor device that operates according to a certain operation clock, comprising:
   a serial communication interface that performs serial communication with outside, according to a unit transfer time based on the operation clock,
   wherein the serial communication interface includes:
      a baud rate generator that generates a basic clock for counting the operation clock to define the unit transfer time, based on a result of the count;
      a transmission/reception controller that controls transmission and reception according to the basic clock generated by the baud rate generator; and
      a bit rate modulator capable of realizing a desired bit rate by partially masking supply of the operation clock to the baud rate generator, according to preset information, and
   wherein the bit rate modulator includes:
      a first counter that counts the operation clock;
      a weight reversing circuit that reverses a weight for output bits of the first counter;
      a first register that allows information for determining a duty of the basic clock to be set;
      a first comparator that compares an output of the weight reversing circuit with an output of the first register; and
      a logic gate that partially masks the supply of the operation clock to the baud rate generator by performing logical operation between a result of comparison by the comparator and the operation clock.

2. The semiconductor device according to claim 1,
   wherein the weight reversing circuit reverses the weight for the output bits of the first counter by changing an order of sequence of the output bits of the first counter.

3. The semiconductor device according to claim 1,
   wherein the baud rate generator includes:
      a second counter that counts an output of the logic gate;
      a second register for setting a bit rate; and
      a second comparator that compares an output of the second counter with an output of the second register to form the basic clock.

4. The semiconductor device according to claim 3,
   wherein the unit transfer time is composed of a plurality of count units in the second counter,
   wherein the transmission/reception controller includes a function of detecting a start bit taken into the serial communication interface from outside to synchronize the count units, and
   wherein an input to the serial communication interface is sampled, based on a certain count result by the second counter after the synchronization.

5. The semiconductor device according to claim 4,
   wherein the semiconductor device is formed as a microcomputer including a CPU that controls operation of the serial communication interface.

* * * * *